(12) United States Patent
Gong et al.

(10) Patent No.: US 11,387,084 B2
(45) Date of Patent: Jul. 12, 2022

(54) UNIFORM PUMPING DUAL-STATION VACUUM PROCESSOR

(71) Applicant: Advanced Micro-Fabrication Equipment Inc, China, Shanghai (CN)

(72) Inventors: Yuejun Gong, Shanghai (CN); Rason Zuo, Shanghai (CN); Tuqiang Ni, Shanghai (CN); Dee Wu, Shanghai (CN); Ning Zhou, Shanghai (CN); Kelvin Chen, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 106 days.

(21) Appl. No.: 16/095,935

(22) PCT Filed: Dec. 27, 2017

(86) PCT No.: PCT/CN2017/118976
§ 371 (c)(1),
(2) Date: Oct. 23, 2018

(87) PCT Pub. No.: WO2018/121603
PCT Pub. Date: Jul. 5, 2018

(65) Prior Publication Data
US 2019/0139745 A1 May 9, 2019

(30) Foreign Application Priority Data

Dec. 27, 2016 (CN) .......................... 201611225147.6

(51) Int. Cl.
*H01J 37/32* (2006.01)
*H01L 21/311* (2006.01)

(52) U.S. Cl.
CPC .. *H01J 37/32899* (2013.01); *H01J 37/32513* (2013.01); *H01J 37/32834* (2013.01);
(Continued)

(58) Field of Classification Search
CPC .......... H01J 37/32834; H01J 37/32633; F04D 17/168
See application file for complete search history.

(56) References Cited

U.S. PATENT DOCUMENTS

2004/0129218 A1* 7/2004 Takahashi ......... H01J 37/32834
118/715
2010/0193132 A1* 8/2010 Wi ...................... H01L 21/6719
156/345.51

* cited by examiner

*Primary Examiner* — Karla A Moore
*Assistant Examiner* — Nathan K Ford
(74) *Attorney, Agent, or Firm* — Womble Bond Dickinson (US) LLP; Joseph Bach, Esq.

(57) ABSTRACT

The present invention relates to a dual-station vacuum processor that pumps uniformly, comprising two vacuum processing chambers that may act as a process processing chamber, and an offset-pumping port and a vacuum pump which are common to and communicate with the two vacuum processing chambers, wherein a damper having a set thickness in a vertical direction is provided in a region proximal to the offset-pumping port in each vacuum processing chamber, so as to lower a pumping rate of gas at the pumping port proximal end and balance the pumping rate with the pumping rate of the gas at the pumping port distal end, thereby ameliorating the impact of chamber offset on the uniformity process processing. The present invention may further provide, in a rib as the damper, a channel in communication with the atmospheric environment outside of the chamber, so as to facilitate connection between a cable pipeline in the chamber and the outside.

8 Claims, 4 Drawing Sheets

(52) U.S. Cl.
CPC ... *H01J 37/32211* (2013.01); *H01J 37/32633* (2013.01); *H01J 37/32733* (2013.01); *H01L 21/31116* (2013.01)

UNIFORM PUMPING DUAL-STATION VACUUM PROCESSOR

RELATED APPLICATIONS

The present application is the national phase of International Application No. PCT/CN2017/118976, filed on Dec. 27, 2017, which claims priority to and the benefit of Chinese Patent Application No. 201611225147.6, filed on Dec. 27, 2016, and the disclosures of which are hereby incorporated herein by reference in their entireties.

CROSS-REFERENCE TO RELATED APPLICATIONS

This application is a 371 of PCT/CN2017/118976 filed on Dec. 27, 2017, which claims priority to Chinese Patent Application No. 201611225147.6 filed on Dec. 27, 2016.

FIELD

The present invention relates to a vacuum-pumping technology for a plasma processing apparatus, and more particularly relates to a dual-station vacuum processor that pumps uniformly.

BACKGROUND

Process pressure control and etching uniformity for an etching apparatus are all involved in designing a vacuum processing chamber. Compared with single-station reactor having only one vacuum processing station, multi-station vacuum processor has a higher throughput: for example, a dual-station vacuum processor will improve productivity due to configuring two vacuum processing chambers for etching processing, respectively; the two chambers share a common set of vacuum generation system, such as a vacuum pump, a throttle valve, and a control unit, which may save cost, effectively save space, and make the structure of the processor compact.

In the single-station vacuum reactor, a pumping port is arranged concentrically with its station, such that gas across the chamber may be uniformly pumped to a process pressure, which ensures a better uniformity of the pressure and flow rate. As shown in FIG. 1, a vacuum pump shared in the dual-station vacuum processor communicates with an offset-pumping port opened at a bottom portion at an adjoining position between the two vacuum processing chambers so as to pump between the two stations, thereby implementing a style of "offset-pumping."

In this way, for each vacuum processing chamber of the dual-station vacuum processor, offset-pumping ports are asymmetrically positioned in the chambers (offset from a concentric pumping port corresponding to a single station reactor); then, a position closer to the offset-pumping port in each vacuum processing chamber has a relatively high pumping rate, and is also easily pumped to a lower pressure; while for a position relatively distant from the offset-pumping port, a relatively long path will affect the pumping rate and the pressure, ununiform etching occur across 0~360° orientation consequently. Besides, increase of a vacuum volume of the dual-station vacuum processor leads to load increase of the vacuum pump; consequently, a vacuum degree required by the process can hardly be reached, and a balance between "high throughput" and "high performance" can hardly be achieved. These drawbacks impede the dual-station vacuum processor from being applied to a high-performance etching process.

SUMMARY

The present invention provides a dual-station vacuum processor that pumps vacuum uniformly, where a novel compensation mechanism is proposed to address the issue of offset-pumping for two vacuum processing chambers, such that under a precondition of ensuring a process pressure, impacts of chamber offset on the uniformity process processing such as etching may be effectively ameliorated.

To achieve the objective above, one technical solution of the present invention is to provide a dual-station vacuum processor configured with two vacuum processing chambers as process processing reaction chambers, and an offset-pumping port and a vacuum pump common to and communicating with the two vacuum processing chambers, wherein In the dual-station vacuum processor, a damper is provided in an adjustment region 61 in each vacuum processing chamber; the damper has a set thickness in a vertical direction, and the damper extends transversely to cause its downward projection to have a region overlapping with the offset-pumping port;

a longitudinally extending baffle plate is provided on a base plate of each vacuum processing chamber, a base for disposing a substrate is mounted on a sealing plate disposed at a top portion of the baffle plate, a bottom portion of a space jointly enclosed by the sealing plate and the baffle plate has a first atmospheric environment channel in communication with an atmosphere environment, and the top portion of the sealing plate and an outer sidewall of the baffle plate are disposed in a vacuum environment in the vacuum processing chamber;

the damper includes one or more ribs that extend transversely from the outer sidewall of the baffle plate of the vacuum processing chamber where the damper is located towards a common sidewall between the two vacuum processing chambers, a tail end of the rib being connected to the common sidewall; and a first channel is opened in the rib, the first channel communicating with a second channel opened in the common sidewall and communicating with the atmospheric environment outside of the vacuum processing chamber via an interface configured to the second channel to thereby form a second atmospheric environment channel.

Preferably, a cable or pipeline in communication with the sealing plate is provided in both of the first atmospheric environment channel and the second atmospheric environment channel.

Preferably, a plasma restraint ring is further provided above the damper, the plasma restraint ring covering a space between the base for disposing the substrate and an inner sidewall of the vacuum processing chamber, a plurality of airflow channels being provided on the plasma restraint ring.

Preferably, after the pumping rate of a gas in the adjustment region is lowered by disposing a damper, it is compared with the pumping rates of the gas in other regions of the vacuum processing chamber, and a difference value there between is within a set threshold range.

Preferably, when the damper is not provided, a path for the gas in the adjustment region to flow to the pumping port is shorter than a path for the gas in other regions of the vacuum processing chamber to flow to the pumping port; after the damper is provided, the gas in the adjustment region bypasses the damper to flow to the pumping port, such that the path for the gas in the adjustment region to flow to the pumping port increases.

Preferably, the adjustment region includes a region in the vacuum processing chamber proximal to the pumping port, and other regions of the vacuum processing chamber include regions distant from the pumping port.

Preferably, one end of the rib is connected to a side of the outer sidewall of the baffle plate proximal to the offset-pumping port, and the other end thereof is connected to a common sidewall.

Preferably, the first channel and the second channel which are communicating with each other are isolated from a vacuum generation system and the vacuum environment in each vacuum processing chamber.

Compared with the prior art, an advantage of the present invention is that a flow resistance may be increased at a position proximal to the pumping port in each vacuum processing chamber of the dual-station vacuum processor, and a damping formed by a baffle plate and/or rib may effectively weaken the pumping rate at the pumping port, while for a position distant from the pumping port, the relatively long path causes the actual pumping rate relatively low such that it may be balanced with the weakened pumping rate. When the present invention is applied to a chamber with two or more stations, the impact of offset-pumping on uniformity process processing may be effectively ameliorated.

Additional advantage of the present invention is that space may be utilized maximally. In the present invention, the transversely extending rib may block the pumping port to form an offset damping to a vacuum pumped air flow; besides, the rib may also be designed into a hollow structure using its thickness in the vertical direction, such that the internal space of the rib further communicates with the internal space of the common sidewall between the chambers, which additionally provides a second atmospheric environment channel that is isolated from the vacuum generation system and the vacuum environment in the chambers and that may communicate with the outside, so as to expand a path for connecting cable pipelines in the chambers to the outside, such that some cables in the cable pipeline originally only disposed in the original first atmospheric environment channel constructed by the baffle plate may be taken away to be arranged in the second atmospheric environment channel, thereby implementing an effective electrical isolation.

DETAILED DESCRIPTION OF EMBODIMENTS

Hereinafter, the present invention will be illustrated with an example of an offset-pumping dual-station vacuum processor applied to a plasma processing apparatus (e.g., an etching apparatus), where two vacuum processing chambers share a set of vacuum generation system.

Two problems need to be solved in designing a dual-station vacuum processor:

1) the pumping channel should be guaranteed unobstructed to increase conductance so as to maximize performance of the vacuum pump, such that the chambers may achieve a desired vacuum degree, thereby guaranteeing a maximum adjustable range of the process pressure.

2) a compensation mechanism should be designed to guarantee uniformity of the pressure and flow rate across 0~360° in a single station chamber: pressure uniformity: <1%; flow rate uniformity: <20%.

Two vacuum processing chambers of the dual-station vacuum processor are adjacently arranged in a common chamber body; each vacuum processing chamber is equipped with components (or shared parts) needed for acting as an etching reaction chamber, for example, including, but not limited to: a ring-shaped chamber wall of the vacuum processing chamber, and a chamber lid for sealing the ring-shaped chamber wall, a gas inlet structure importing reaction gas into the vacuum processing chamber, and a base 90 for disposing a to-be-processed substrate, which will not be detailed one by one.

Figure 1:
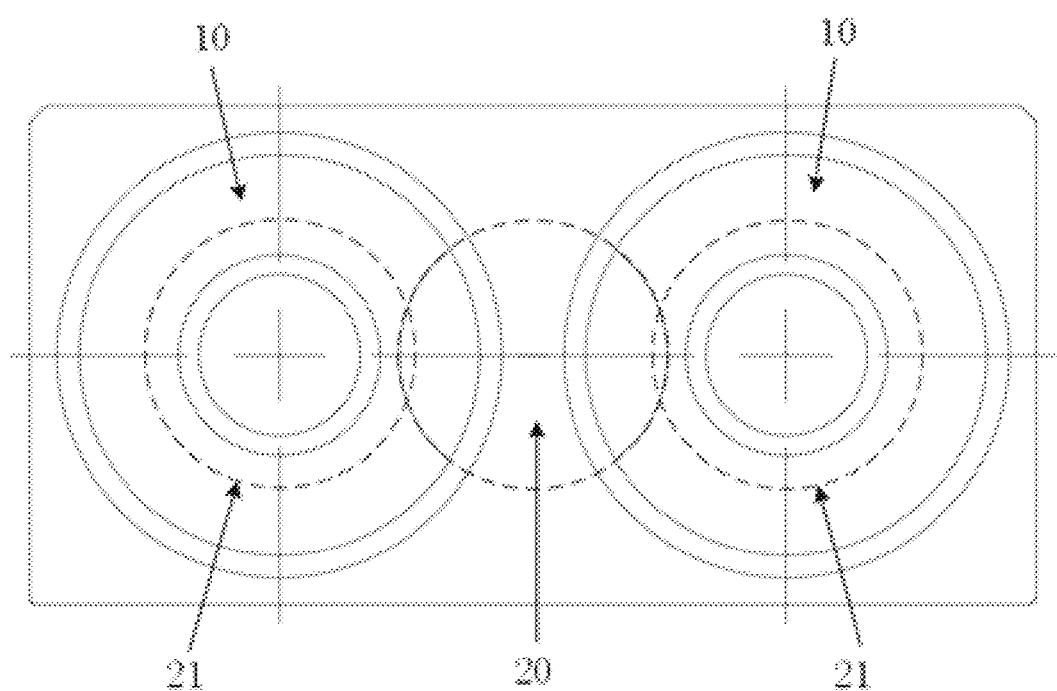
FIG. 1 is a top view schematic diagram of an existing dual-station vacuum processor.
Figure 2:
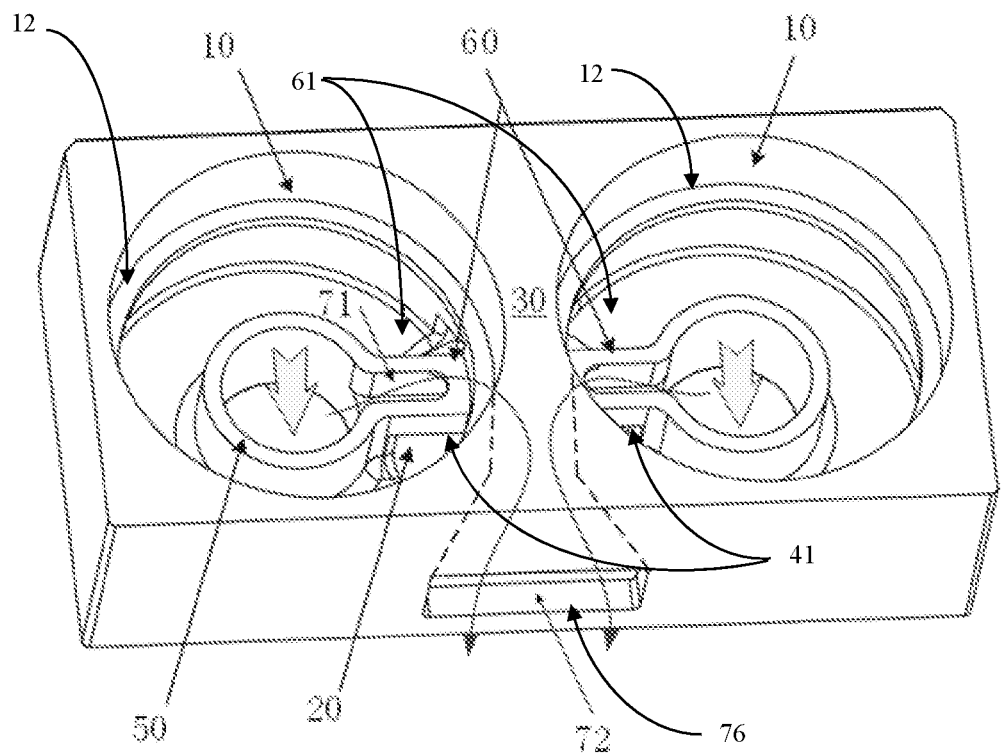
FIG. 2 is a structural schematic diagram of a dual-station vacuum processor in the present invention.
Figure 3:
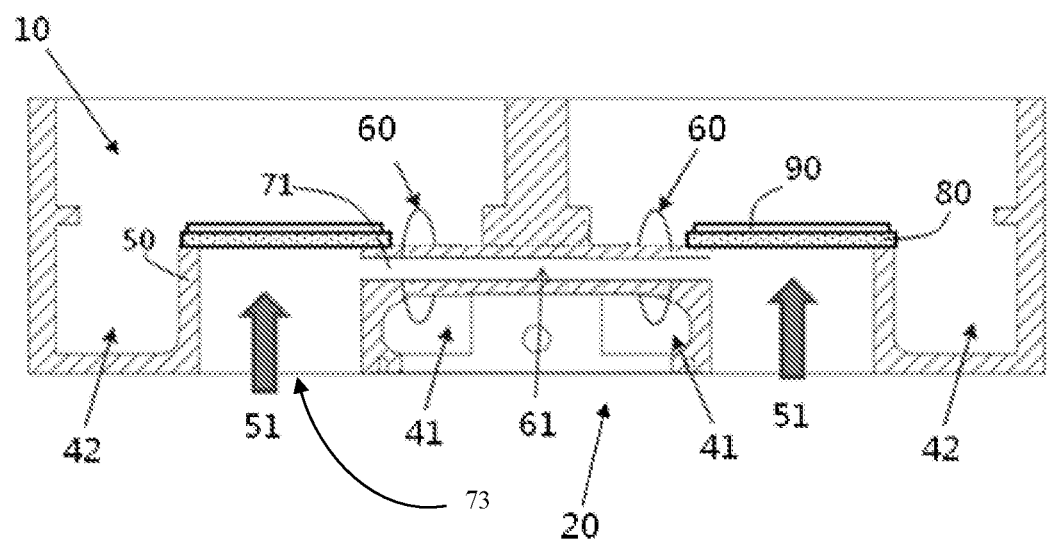
FIG. 3 is a side sectional schematic diagram of a dual-station vacuum processor in the present invention.

As illustrated in FIGS. 2 and 3, a baffle plate 50 is provided upon and extending upward from a bottom plate in each vacuum processing chamber 10; the base 90 for disposing the to-be-processed substrate 21 (FIG. 1) is mounted on a sealing plate 80 at a top portion of the baffle plate 50. The baffle plate 50 in this example is arranged to surround the center axis of the vacuum processing chamber 10. During vacuum processing, the space above the sealing plate 80 is vacuumed, and the space below the sealing plate 80 keep atmospheric environment. Namely, by employing the sealing plate 80, a region enclosed by the baffle plate 50 in the vacuum processing chamber 10 constitutes an airtight cavity isolated from other parts in the vacuum processing chamber 10, such that when the vacuum processing chamber 10 is vacuumed, the airtight cavity still communicate with the atmospheric environment outside of the vacuum processing chamber 10 through a plurality of ports or channels, wherein a port defining a first atmospheric environment channel 51 that may communicate with the atmospheric environment is, for example, opened at a bottom portion of the region enclosed by the baffle plate 50.

The two vacuum processing chambers 10 share a set of vacuum generation system, wherein the vacuum generation system includes a vacuum pump knot shown), further includes devices such as a throttle vale, a control unit, etc. A sidewall adjoining the two vacuum processing chambers 10 is a shared sidewall. An offset-pumping port 20 is settled at the bottom plate corresponding to the position below the common sidewall 30, both the two vacuum processing chambers 10 communicate with the offset-pumping port 20; the common vacuum pump settled below the offset-pumping port 20 is communicating with the offset-pumping port 20 so as to vacuum each of the vacuum processing chambers 10 during vacuum process procedure.

To solve the above problems of the dual-station vacuum processor, the present invention provides a compensation mechanism, asymmetrically increase the flow resistance in a region (referred to as a offset-pumping port 20 proximal end 41) in each vacuum processing chamber 10 proximal to the offset-pumping port 20 so as to weaken the pumping rate near the offset-pumping port 20, e.g., by providing members such as a rib with a certain thickness and/or a baffle to form an offset damping; while the gas in a region (referred to as a offset-pumping port 20 distal end 42) distant from the offset-pumping port 20, therefore gas flow path from distal end 42 to the offset-pumping port 20 is relatively long, causing that the actual flow rate is relatively low, such that the flow rate in distal end 42 is balanced with the compensated flow rate at the offset-pumping port 20 proximal end 41, thereby improving the uniformity of the process carry out in a offset vacuum pumping dual station reactor.

A rib 60 (encircled) is provided with the first end fixed to the sidewall of the baffle plate 50 proximal to the offset-pumping port 20, the rib 60 extending transversely towards the common sidewall 30 and having a certain thickness in the vertical direction, wherein the downward projection of the rib 60 blocks part of the offset-pumping port 20 at the chamber side, constructing an offset damping of the offset-pumping port 20 proximal end 41. A tail end of the rib 60 of each vacuum processing chamber 10 is connected to the common sidewall 30 of the two vacuum processing chamber 10, respectively; moreover, a first channel 71 is formed inside the rib 60 of the each vacuum processing chamber 10, one end of the first channel 71 is communicating with a region enclosed by the baffle plate 50, the other end thereof is communicating with a second channel 72 settled in the common sidewall 30, the second channel 72 being further communicating with an atmospheric environment outside of the vacuum processing chamber 10 via a second port 76.

In this way, the space of the airtight cavity is expanded such that the region enclosed by the baffle plate 50, the first channel 71, the second channel 72, and the airtight cavity communicating with the atmospheric environment via the first port 73 and the second port 76, respectively, airtight cavity are isolated from the vacuum generation system, the space in each vacuum processing chamber 10 above the sealing plate 80. When performing vacuum pumping, the gas at the offset-pumping port 20 proximal end 41 in the each vacuum processing chamber 10 may bypass the rib 60 working as the offset damping to flow to the offset-pumping port 20 so as to slow the flow rate of the region.

In each vacuum processing chamber 10, cable pipelines for connecting corresponding internal and external components of the vacuum processing chamber 10 need to be arranged, including, e.g., a gas transportation pipeline, a coolant pipeline, a high-voltage DC cable, an RF cable, etc. All the various cable pipelines need to be arranged in the atmospheric environment in the vacuum processing chamber 10 and connected to corresponding parts in the vacuum environment in the vacuum processing chamber 10. Particularly, different cables need to be electrically isolated to avoid signal interference, such that enough interval distance should be ensured between frames of a plurality of cables. Furthermore the cable pipelines should keep enough space for component test, repair or other maintain actions. However, the space of the first atmospheric environment channel 51 from the region enclosed by the baffle plate 50 to the first port is insufficient to arrange the all the cables and their frames; to address this issue, a second atmospheric environment channel 61 from the first channel 71 and the second channel 72 to the second port is additionally provided in communication with the region enclosed by the baffle plate 50 so as to arrange part of the cables that need electrical isolation; the cables in the second atmospheric environment channel 61 may conveniently pass through the sealing plate 80 to be connected to the base 90 for disposing a to-be-processed substrate, thereby implementing effective isolation from the cables in the first atmospheric environment channel 51. In other examples, the first atmospheric environment channel 51 and the second atmospheric environment channel 61 do not communicate with each other (not shown), but communicate with the outside atmospheric environment, respectively.

Figure 4:
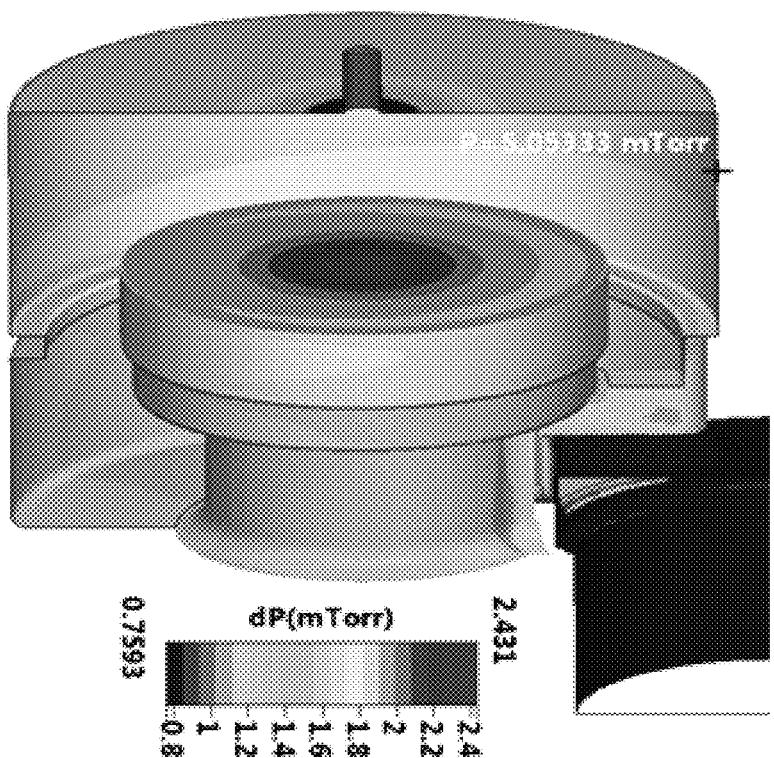
FIG. 4 is a model verification schematic diagram of a dual-station vacuum processor in the present invention.
Figure 5:
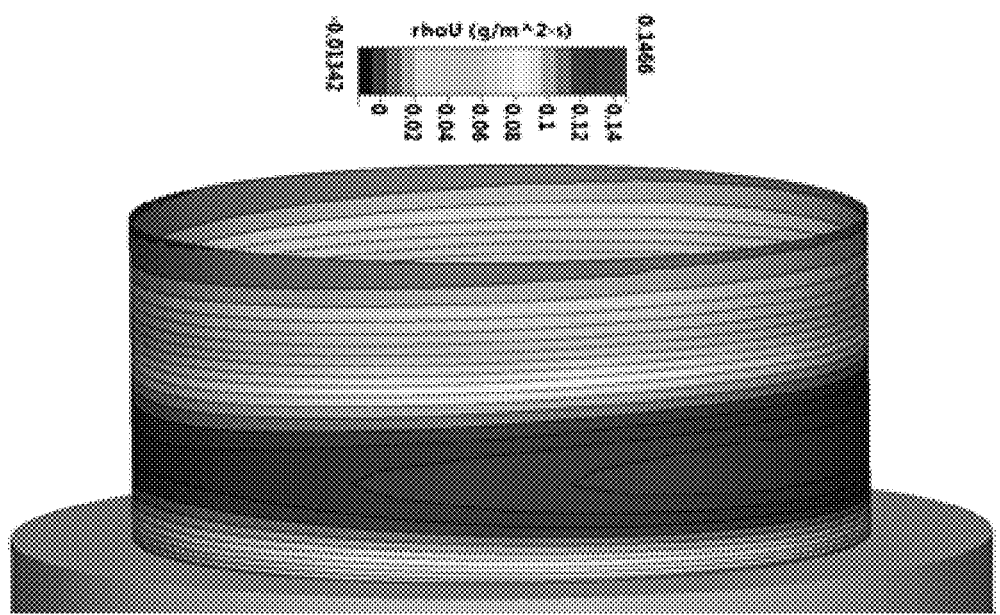
FIG. 5 is a flow rate verification schematic diagram of a dual-station vacuum processor in the present invention.
Figure 6:
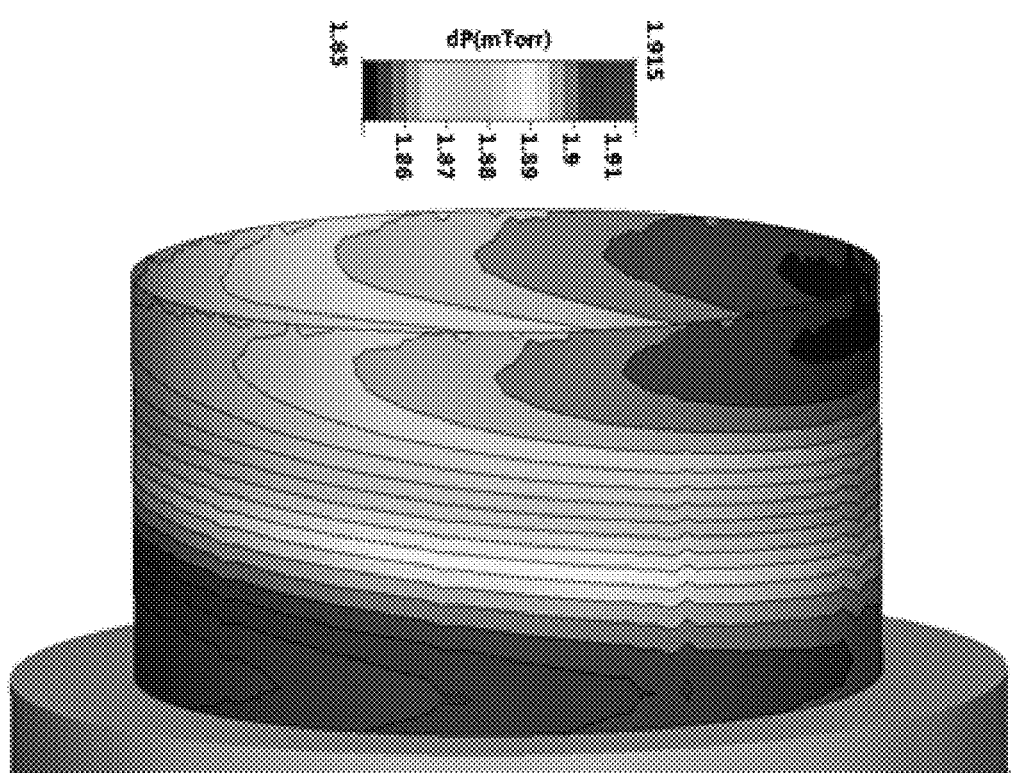
FIG. 6 is a pressure verification schematic diagram of a dual-station vacuum processor in the present invention.

FIG. 4 is a model verification schematic diagram of the dual-station vacuum processor according to the present invention, showing air pressure distributions in one chamber thereof and at the common vacuum pump; FIG. 5 is a flow rate verification schematic diagram of the exemplary structure of the present invention with a flow rate of 400 sccm (the uniformity reaches 18.9%); FIG. 6 is a pressure verification schematic diagram of the exemplary structure of the present invention with a flow rate of 400 sccm (the uniformity reaches 0.9%). It is seen that the present invention may effectively improve the uniformity of the internal flow rate and the pressure in a single chamber in the dual-station vacuum processor.

The present invention may design the specific structure, amount, or position of the offset damping based on actual needs of adjusting the uniformity of the flow rate and the pressure in the chamber. In different embodiments, a shape of the ribs is not limited, e.g., the cross section of the ribs could selected from a circular shape, a semi-circle shape, a rectangular shape, etc.; the amount and layers of the ribs are not limited, e.g., a plurality of ribs may be longitudinally stacked and/or planarly combined to form the offset damping. The ribs may be integrally formed with the baffle plate 50 or manufactured as an independent component and assembled with the baffle plate 50. The shape of the airtight cavity and the shape and amount of the baffle plate 50 for enclosing the airtight cavity are not limited either.

Or, in some other examples, supposing that the second atmospheric environment channel 61 needn't be provided (but still guaranteeing the isolation of the first atmospheric environment channel 51 from the vacuum process chamber), the common sidewall 30 between two chambers as well as the ribs in respective chambers are not necessary to be hollowed; moreover, tail ends of the respective ribs are not required to contact with the common sidewall 30, i.e., a gas flowing path for the gas to flow to the offset-pumping port 20 during vacuum pumping is reserved between the tail ends of the ribs and the common sidewall 30; and the gas at the offset-pumping port 20 proximal end in the chamber may simultaneously bypass the ribs to flow to the offset-pumping port 20. By designing ribs with different transverse extending lengths, the width of the gas flowing path between the tail ends of the ribs and the common sidewall 30 may be adjusted to thereby control the pumping rate at the offset-pumping port 20 proximal end.

Besides being disposed near the offset-pumping port 20, the damper in the present invention may also be disposed in one or more other regions where the flow rate and the pressure need to be adjusted in each chamber, e.g., disposed the damping in a region where the original pumping rate is too high, so as to balance the pumping rate in damping region with the actually lower pumping rate in a region without disposing the damping. The present invention can prolong the path to the offset-pumping port 20 and slowing the pumping rate, such that even an asymmetrical chamber structure may achieve a uniform flow field and pressure field in a single chamber, which guarantees achieving a desired etching process performance. Preferably, in the dual-station vacuum processor, although the structures of the offset-pumping, offset damping or circulation space of each chamber are asymmetrically arranged, the corresponding pumping structures and compensation mechanism in the two chambers are mutually symmetrical.

The damping device in the present invention may improve the uniformity gas flow between the offset-pumping port 20 proximal end 41 and the offset-pumping port 20 distal end 42 of the two vacuum processing chambers; however, for a processing recipes require a high gas flow uniformity, the uniformity of the flow rate at different positions on the substrate cannot achieve below 3% only with the damping device. Therefore, a plasma confinement ring 12 may be further provided above the damping device. The plasma confinement ring is disposed between the base for disposing the substrate and the inner wall of the vacuum processing chamber. A plurality of air flow channels are provided on the plasma confinement ring. These channels may be apertures or elongated grooves. The depth, width, and cross section of these apertures or grooves may be designed such that the plasmas exist only above the confinement ring, while those plasmas passing through the confinement ring will all be extinguished. The gas flow channels on the confinement ring may also be designed asymmetrically to compensate for the imbalance of gas flow between the offset-pumping port 20 proximal end 41 and the offset-pumping port 20 distal end 42. Due to existence of the damping device in the present invention in conjunction with gas flow adjustment by the confinement ring, an uniform gas flow distribution may be finally achieved in different regions of the substrate.

Based on the compensation mechanism, the vacuum pumping mechanism of the present invention may be adapted to a multi-station vacuum processor, and when more than two vacuum processing chambers share a vacuum generation system, the impact of offset pumping on each chamber will be ameliorated. Besides ameliorating issues of ununiform flow rates and pressures at various positions in a single chamber caused by offset pumping, the vacuum pumping system and method according to the present invention are also applicable to address issues of ununiform pumping due to the factors inside the chamber (e.g., asymmetrical profile of component in the chamber, and ununiform distribution of gas in the chamber after repeat distributions through the gas inlet or the gas flowing guide structure above/surrounding the base, etc.).

Although the contents of the present invention have been described in detail through the foregoing preferred embodiments, it should be understood that the depictions above shall not be regarded as limitations to the present invention. After those skilled in the art having read the contents above, many modifications and substitutions to the present invention are all obvious. Therefore, the protection scope of the present invention should be limited by the appended claims.

We claim:

1. A dual-station vacuum processor comprising:
   two vacuum processing chambers, wherein the two vacuum processing chambers share a common sidewall and communicate with an offset-pumping port positioned below the common sidewall, wherein:
   in the dual-station vacuum processor, a damper is provided in an adjustment region in each vacuum processing chamber;
   a vertically extending baffle plate is provided on a bottom plate of each vacuum processing chamber and arranged to surround a center axis of each vacuum processing chamber;
   each of the two vacuum processing chambers comprises a base for disposing a substrate, the base is mounted on a sealing plate set to the top portion of the baffle plate, thereby defining a chamber jointly enclosed by the sealing plate and the baffle plate, wherein the bottom portion of the chamber has a first atmospheric environment channel in communication with an atmosphere environment, and the top portion of the sealing plate and an outer sidewall of the baffle plate are in fluidic communication with the offset pumping port;
   the damper of each vacuum processing chamber comprises a rib that extends transversely from the outer sidewall of the baffle plate towards the common sidewall between the two vacuum processing chambers, a tail end of the rib being connected at the common sidewall to the tail end of the opposing rib of opposing vacuum processing chamber of the dual-station vacuum processor, and wherein a downward projection of the rib blocks part of the offset-pumping port; and
   a first channel is provided in the rib of each vacuum processing chamber in fluidic communication with the first atmospheric environment channel, the first channel extending through to the first channel in the opposing rib, the first channel fluidly communicating with a second channel provided in the common sidewall and communicating with the atmospheric environment outside of the vacuum processing chamber via an atmospheric port provided in the second channel, the first channel of each rib, the second channel and the port form together a second atmospheric environment channel.

2. The dual-station vacuum processor according to claim 1, wherein the first atmospheric environment channel and the second atmospheric environment channel are configured to enable at least one cable or pipeline to connect to the sealing plate through the first atmospheric environment channel and the second atmospheric environment channel.

3. The dual-station vacuum processor according to claim 2, wherein a plasma confinement ring is further provided above the rib, the plasma confinement ring covering a space between the base for disposing the substrate and an inner sidewall of the vacuum processing chamber, a plurality of gas flow channels being provided on the plasma confinement ring.

4. The dual-station vacuum processor according to claim 1, wherein the pumping rate of a gas in the adjustment region is lowered by disposing the damper, the gas pumping rate difference between the adjustment region and other regions of the vacuum processing chamber is under a predetermined threshold range.

5. The dual-station vacuum processor according to claim 4, wherein the gas in the adjustment region bypasses the damper to flow to the offset-pumping port.

6. The dual-station vacuum processor according to claim 4, wherein the adjustment region includes a region in the vacuum processing chamber proximal to the offset-pumping port, and other regions of the vacuum processing chamber include regions distant from the pumping port.

7. The dual-station vacuum processor according to claim 6, wherein the rib is connected to the outer sidewall of the baffle plate proximal to the offset-pumping port.

8. The dual-station vacuum processor according to claim 1, wherein the first channel and the second channel which are communicating with each other are isolated from a vacuum generation system and each vacuum processing chamber.

* * * * *